United States Patent
Esser et al.

(10) Patent No.: US 8,356,820 B2
(45) Date of Patent: Jan. 22, 2013

(54) PISTON RING

(75) Inventors: Johannes Esser, Odenthal (DE); Frank Münchow, Wermelskirchen (DE)

(73) Assignee: Federal-Mogul Burscheid GmbH, Burscheid (DE)

( * ) Notice: Subject to any disclaimer, the term of this patent is extended or adjusted under 35 U.S.C. 154(b) by 559 days.

(21) Appl. No.: 12/527,051

(22) PCT Filed: Dec. 18, 2007

(86) PCT No.: PCT/DE2007/002279
§ 371 (c)(1),
(2), (4) Date: Aug. 13, 2009

(87) PCT Pub. No.: WO2008/098534
PCT Pub. Date: Aug. 21, 2008

(65) Prior Publication Data
US 2010/0044967 A1   Feb. 25, 2010

(30) Foreign Application Priority Data
Feb. 17, 2007   (DE) .......... 10 2007 007 962

(51) Int. Cl.
*F16J 9/26* (2006.01)
(52) U.S. Cl. .......... 277/440; 277/444
(58) Field of Classification Search .......... 277/442–444, 277/460
See application file for complete search history.

(56) References Cited

U.S. PATENT DOCUMENTS

| | | | | |
|---|---|---|---|---|
| 3,595,590 A * | 7/1971 | Beyer | ........................... | 277/444 |
| 3,615,099 A * | 10/1971 | Prasse | ........................... | 277/444 |
| 3,661,402 A * | 5/1972 | Iizuka | ........................... | 277/442 |
| 3,671,047 A * | 6/1972 | Umezawa | ........................ | 277/444 |
| 4,077,637 A * | 3/1978 | Hyde et al. | ..................... | 277/444 |
| 4,106,782 A * | 8/1978 | Hyde et al. | ..................... | 277/444 |
| 4,185,843 A * | 1/1980 | Beyer et al. | .................... | 277/441 |
| 4,251,599 A * | 2/1981 | McCormick | ................... | 428/682 |
| 4,256,318 A * | 3/1981 | Bush | .......................... | 277/435 |
| 4,307,890 A * | 12/1981 | Cromwell et al. | ............ | 277/441 |
| 4,323,257 A * | 4/1982 | Kondo et al. | ................... | 277/441 |
| 5,794,943 A * | 8/1998 | Atmur et al. | ................... | 277/441 |
| 6,139,022 A * | 10/2000 | Iwashita et al. | ............... | 277/443 |
| 6,149,162 A * | 11/2000 | Tanaka et al. | .................. | 277/443 |
| 7,458,585 B2 * | 12/2008 | Hamada et al. | .............. | 277/442 |
| 7,871,078 B2 * | 1/2011 | Fischer et al. | ................. | 277/442 |
| 2005/0218603 A1 * | 10/2005 | Fischer | ......................... | 277/443 |
| 2010/0019457 A1 * | 1/2010 | Esser et al. | ..................... | 277/442 |
| 2010/0044967 A1 * | 2/2010 | Esser et al. | ..................... | 277/442 |

FOREIGN PATENT DOCUMENTS

| | | |
|---|---|---|
| DE | 2036495 | 2/1971 |
| DE | 2050441 | 6/1971 |
| DE | 10221800 A1 | 12/2003 |
| DE | 10359802 B3 | 3/2005 |
| EP | 1482075 | 12/2004 |
| GB | 1078992 A | 8/1967 |
| JP | 59138757 A | 1/1983 |

* cited by examiner

*Primary Examiner* — Vishal Patel
(74) *Attorney, Agent, or Firm* — Robert L. Stearns; Dickinson Wright, PLLC

(57) ABSTRACT

The invention relates to a piston ring, having a base body, which comprises a running surface provided with a chamber, an upper and a lower flank surface, and an inner circumferential surface, wherein at least the chamber is provided with at least one wear protection layer, and a PVD cover layer is applied to the running surface at least in some regions such that the base body has the PVD cover layer only in the edge regions, which is to say outside of the chamber, in the finished state.

6 Claims, 1 Drawing Sheet

PISTON RING

BACKGROUND OF THE INVENTION

1. Technical Field

Figure 1:
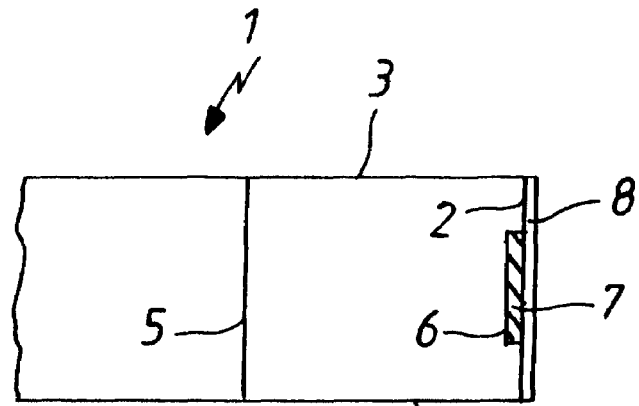

The invention concerns a piston ring, with a main body, which exhibits a contact surface provided with a recess an upper and a lower side surface, and an inner circumferential surface.

2. Related Art

In EP-A 1 482 075, a piston ring coating is described which is made of tungsten disulfide.

The formation of the lower contact edge of a piston ring is of great importance for oil management in a combustion engine. It is a challenge in manufacturing the piston ring to produce as small an edge as possible, in order to obtain as good a stripping effect as possible during engine operation. Such small and sharp edges enable an uncoated ring to be produced relatively simply. Although today, coated rings are fundamentally necessary in the first groove of combustion engines. There is a conflict of goals here between the desired small operating edge and a blow-by- and crack-free coated edge.

One known way to manufacture relatively sharper contact edges for coated rings is the use of fully or one-sided recessed rings. A disadvantage of these rings is that a certain portion of the contact surface is not principally required to be provided with a protective coating, and in this area, in which the basic material then comes into contact with the cylinder, there often occurs so-called firing trace build-up.

The invention is based on the problem of developing a piston ring that by optimizing oil management by using a contact surface provided with at least one recess, the disadvantages mentioned are no longer present.

This problem is solved by means of a piston ring with a main body, which exhibits a contact surface provided with a recess an upper and a lower side surface, and an inner circumferential surface, whereby at least the recess is provided with a wear-protection layer, and a PVD coating layer is applied at least partially to the contact surface, to the effect that the main body in its finished state exhibits the PVD coating layer merely on the edge region side, that is, outside the recess.

Physical-vapor-deposition (PVD) coating is a process in which the coating of the contact surface of the piston ring occurs by means of deposition from the vapor phase. The coating material being deposited exists, at the same time, as a stream of ionized particles.

By means of the invention subject matter, it is now possible, by attaining a desired small-sized operating edge, to produce a blow-by- and crack-free contact surface coating in the edge area.

It is a special advantage that one-sided or completely recessed piston rings can be provided made of cast or steel materials with a galvanically or thermally applied wear-protection layer.

According to the invention, in the finished state of the piston ring, the respective edge area, that is, outside the recess is provided with the PVD coating layer. As a result of achieving this, it may be that either just the edge region is provided with the PVD coating layer, or else the whole contact surface including the recess be coated with a PVD coating layer and the PVD coating layer is subsequently removed in the area of the recess, by grinding, for example.

As a further idea according to the invention, the PVD layer is formed on the basis of nitrides of elements in groups IV B to VI B of the periodic table. Optionally, the following elements can be added, alone or in combination: Al, Si, C, O.

Especial advantageous are so-called PVD-DLC (diamond-like carbon) coatings, which are applied to the contact surface of piston rings. They form especially wear-resistant surfaces with a low coefficient of friction and are also resistant to higher temperatures. DLC layers in addition exhibit good adhesion to the main body and a high rupture strength.

THE DRAWINGS

Figure 2:
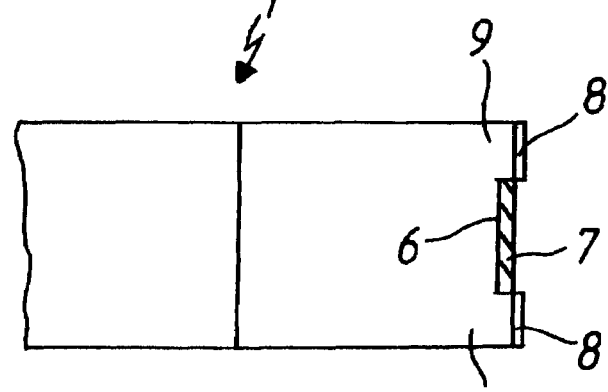
Figure 3:
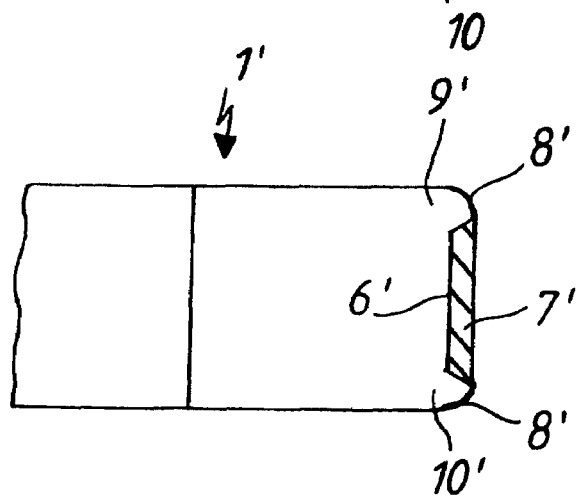

The subject matter of the invention is represented with the aid of one embodiment in the drawing and is described as follows. Shown are:

FIG. 1 A piston ring in cross-section, which is provided on the contact surface side with a recess on which is deposited a PVD coating layer;

FIG. 2 A piston ring according to FIG. 1, with a partially removed coating layer;

FIG. 3 An alternative embodiment of a piston ring.

DETAILED DESCRIPTION

FIG. 1 shows a piston ring 1, which exhibits a main body rectangular in cross-section involving a contact surface 2, an upper 3 and a lower side surface 4, and an inner circumferential surface 5. The contact surface 2 is provided with a recess 6, on which a wear-protection layer 7, for example of chromium, is introduced. A PVD coating layer 8 of CrN is deposited on the entire contact surface 2, including the recess 6, which in this example may exhibit a thickness of 8 µm. Alternative materials, such as CrON for example, are likewise conceivable as a PVD coating layer.

FIG. 2 shows the finished state of the piston ring 1. It is seen that the recess 6, or rather to the wear-protection layer 7 present there, is free of the PVD coating layer 8 according to FIG. 1. This might be obtained by partially grinding off the PVD coating layer 8 in the area of the recess 6. Consequently, only the edge areas 9, 10 remain covered with the PVD coating layer 8. Since these edge areas 9, 10 protrude radially facing the wear-protection layer 7, a oil trap is formed for the moment, which is advantageous for the intake behavior of the piston ring 1.

FIG. 3 shows an alternative to FIG. 1. The piston ring 1' represented here also involves a recess 6', onto which a wear-protection layer 7' is introduced. In this example, only the edge areas 9', 10' outside the recess 6' are provided with a PVD coating layer 8'.

The invention claimed is:

1. A piston ring, with a main body, which exhibits a contact surface provided with a recess, an upper and a lower side surface, and an inner circumferential surface, in which at least the recess is provided with a wear-protection layer of chromium having a thickness of 10 to 100 µm and a PVD coating layer of nitride elements including at least one of CrN and CrON having a thickness of 0.5 to 10 µm is at least partially applied to the contact surface, to the effect that the main body in its finished state exhibits the PVD coating layer merely on opposite edge area sides of the contact surface outside the recess, said PVD coating layer protruding radially outwardly from said wear-protection layer to provide a recessed annular oil trap between said opposite edge area sides.

2. A piston ring according to claim 1, wherein the PVD coating layer includes CrN and CrON.

3. A piston ring according to claim 1, wherein the PVD coating layer is applied by subsequently coating the respective edge areas of the main body.

4. A piston ring according to claim 1, wherein the PVD coating layer is applied over the entire contact surface, in which the PVD coating layer is removed in the area of the recess.

5. A piston ring according to claim 1, wherein the wear-protection layer is applied galvanically or thermally to the contact surface.

6. A piston ring according to claim 1, including addition of at least one element to the coating layer of nitride elements selected from the group consisting of Al, Si, C and O.

* * * * *